(12) United States Patent
Mizuno et al.

(10) Patent No.: US 6,653,964 B2
(45) Date of Patent: Nov. 25, 2003

(54) FILTERING METHOD AND A/D CONVERSION APPARATUS HAVING FILTERING FUNCTION

(75) Inventors: Tamotsu Mizuno, Chita-gun (JP); Takamoto Watanabe, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/207,434

(22) Filed: Jul. 29, 2002

(65) Prior Publication Data
US 2003/0025625 A1 Feb. 6, 2003

(30) Foreign Application Priority Data
Jul. 31, 2001 (JP) .......................... 2001-231675

(51) Int. Cl.[7] .............................................. H03M 1/12
(52) U.S. Cl. ........................................ 341/155; 341/144
(58) Field of Search ................................ 341/155, 144, 341/143, 110, 118

(56) References Cited

U.S. PATENT DOCUMENTS

| 5,128,624 | A |   | 7/1992 | Hoshino et al. | |
|---|---|---|---|---|---|
| 5,525,899 | A |   | 6/1996 | Watanabe et al. | |
| 5,764,523 | A | * | 6/1998 | Yoshinaga et al. | 364/483 |
| 5,872,531 | A | * | 2/1999 | Johnson et al. | 341/110 |
| 5,987,484 | A | * | 11/1999 | Sherry et al. | 708/300 |
| 6,137,349 | A | * | 10/2000 | Menkhoff et al. | 327/552 |
| 6,188,721 | B1 | * | 2/2001 | Shirani et al. | 375/232 |
| 6,211,803 | B1 | * | 4/2001 | Sunter | 341/120 |
| 6,342,850 | B1 | * | 1/2002 | Borer et al. | 341/156 |

FOREIGN PATENT DOCUMENTS

| JP | 3-220814 | 9/1991 |
|---|---|---|
| JP | 7-154256 | 6/1995 |
| JP | 8-32408 | 2/1996 |

* cited by examiner

*Primary Examiner*—Jean Bruner JeanGlaude
*Assistant Examiner*—Joseph Lauture
(74) *Attorney, Agent, or Firm*—Harness, Dickey & Pierce, PLC

(57) ABSTRACT

In an A/D conversion apparatus comprising an A/D converter (4) and a digital moving average filter (6) for removing high-frequency signal components, there is provided an analog moving average filter (2) at a first stage. A sampling frequency of the filters (6 and 2) is set to fsd=n×fsa (where n is a positive integer of 1, 2, ---). As a result, it becomes possible to superimpose an unnecessary signal passing area that appears at every frequency of n times the sampling frequency fsd in the filter (6), on an area of infinite attenuation that appears at every frequency of n times the sampling frequency fsa in the filter (2). In the apparatus as a whole, it becomes possible to efficiently attenuate unnecessary high-frequency signal components. It is also possible to obtain a similar effect when a time A/D converter is used in place of the analog moving average filter (2) and the A/D converter (4).

10 Claims, 14 Drawing Sheets

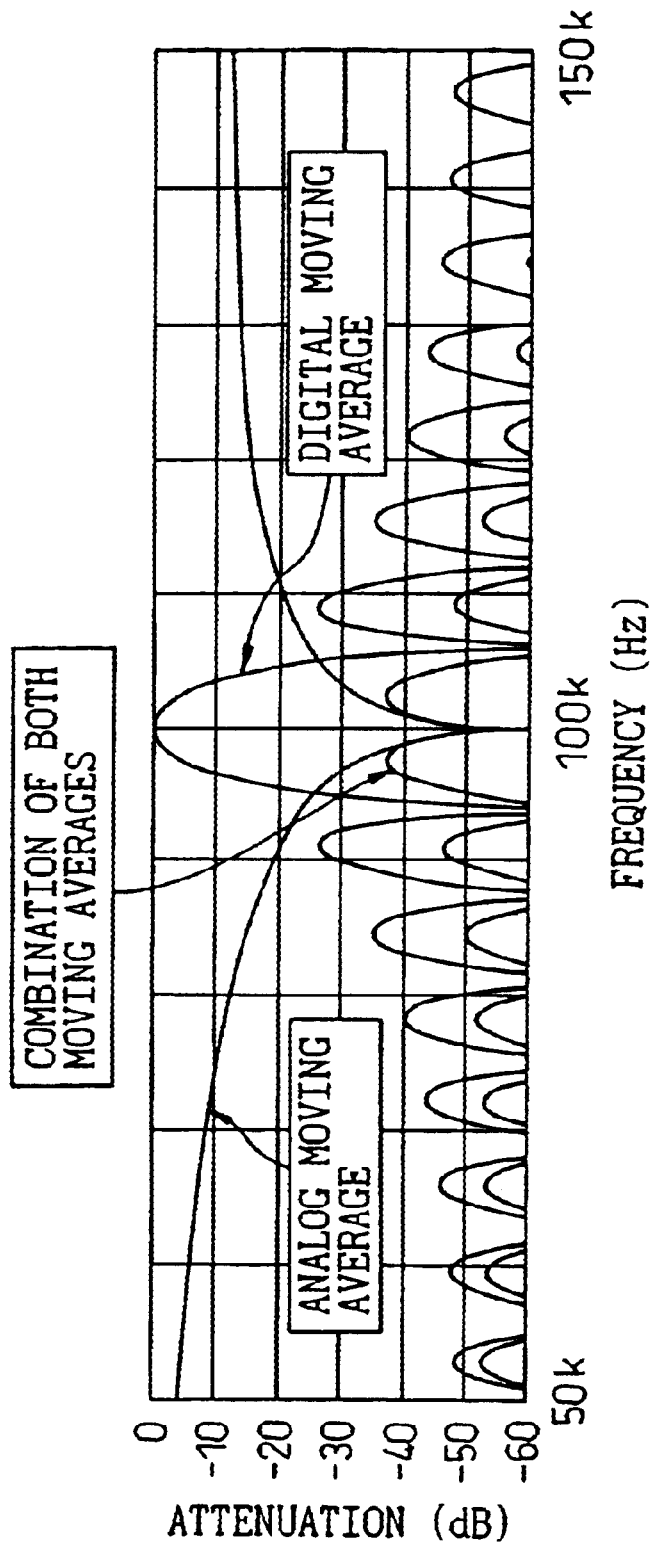

FILTERING METHOD AND A/D CONVERSION APPARATUS HAVING FILTERING FUNCTION

BACKGROUND OF THE INVENTION

1. Field of the Invention

The present invention relates to a filtering method and an A/D conversion apparatus having a filtering function, for generating digital data from an analog input signal after removing unnecessary high frequency signal components therefrom.

2. Description of the Related Art

Conventionally, in a control unit consisting of a microcomputer or the like, there has been used an A/D conversion apparatus constructed of an analog CR filter 3, an A/D converter 4, and a digital moving average filter 6 as shown in FIG. 12a, for example, in order to fetch detection signals (analog input signals Vin) from various sensors that detect an operational status of an object to be controlled.

The digital moving average filter 6 is a unit that removes unnecessary noise components (high-frequency signal components) from digital data Dad that occur as a result of A/D conversion by the A/D converter 4. For example, as shown in FIG. 12c, the digital moving average filter 6 is structured such that latch circuits LT at a plurality of stages operate in synchronism with a clock CKSD at a constant period to sequentially latch the digital data Dad from the A/D converter 4. Adder circuits ADD add outputs from these latch circuits LT, thereby to carry out moving average processing of the digital data Dad.

In other words, in the digital moving average filter 6, the latch circuits LT sequentially sample the digital data Dad at a plurality of stages in synchronism with the clock CKSD. The adder circuits ADD add the digital data Dad that have been sampled a plurality of times in the past, and average the digital data Dad. The averaged result is output as digital data DT that expresses a true A/D conversion result.

The digital moving average filter 6 may be realized by arithmetic processing (what is called a smoothing processing) of a microcomputer that constitutes the control unit, instead of the digital circuit as shown in FIG. 12c.

On the other hand, when the A/D converter 4 carries out A/D conversion of the analog input signal Vin, an aliasing phenomenon of high-frequency signal components occurs, when the frequency of the analog input signal Vin becomes equal to or above one half of a sampling frequency fad of the A/D converter 4. Therefore, the analog CR filter 3 is provided as what is called a pre-filter at a pre-stage of the A/D converter 4, in order to remove the frequency components of not less than one half of the sampling frequency fad of the A/D converter 4 from the analog input signal Vin.

The analog CR filter 3 is structured as shown in FIG. 12b. The analog CR filter 3 has a non-inversion input terminal (+) of an operation amplifier OP1 grounded to the earth, has a capacitor C1 and a resistor RI connected in parallel between an inversion input terminal (−) of the operation amplifier OP1 and an output terminal, and has an input signal (analog) input to the inversion input terminal (−) of the operation amplifier OP1 via a resistor R2.

In other words, the analog CR filter 3 integrates the analog input signal Vin based on the resistances of resistors R1 and R2, the capacity of a capacitor C1, and the determined time constant. Based on this integration, the analog CR filter 3 limits the frequency of the analog input signal Vin input to the A/D converter 4 to less than one half of the sampling frequency fad of the A/D converter 4 according to a known "sampling theorem".

According to the A/D conversion apparatus that has the conventional filtering function having the above structure, the attenuation of a signal based on the digital moving average filter 6 becomes extremely small (approximately zero) at each of the frequencies of n times (where n is a positive integer including 1) the sampling frequency fsd (the frequency of the clock CKSD) (hereinafter referred to as "frequency range"). Unnecessary signal components pass through in this frequency range. Therefore, it is necessary to set the frequency versus attenuation characteristics of the analog CR filter 3 to be used as the pre-filter, such that the attenuation changes as steeply as possible in the frequency range in which the frequency exceeds the cutoff frequency. For this purpose, it has been necessary to increase the order of the analog CR filter 3, and lower the cutoff frequency.

FIG. 13a shows the frequency versus attenuation characteristics of the digital moving average filter 6 that carries out the moving average processing twice to average the digital data for the past sixteen times, with the sampling frequency fsd set to 100 kHz. As is clear from this diagram, according to the digital moving average filter 6 that uses the sampling frequency fsd as 100 kHz, the attenuation becomes approximately zero in the frequency range in which the frequency is n times the sampling frequency fsd like 100 kHz, 200 kHz, 300 kHz, etc. Therefore, it is not possible to remove unnecessary signal components in this frequency area.

For the above reason, when a low-order filter (specifically, a CR linear filter) is used for the analog CR filter 3, for example, it is not possible to make the signal attenuation sufficiently large in a high-frequency signal passing range (a frequency range of n×fsd) that is generated by the digital moving average filter 6 as shown by a one-point chain line in FIG. 13b. As a result, unnecessary high-frequency signal components pass through this frequency range.

Therefore, in order to prevent the above problem, it is necessary to increase the order of the analog CR filter 3 to as high a level as possible, and the analog CR filter 3 attenuates the high-frequency signal components that cannot be attenuated by the digital moving average filter 6. For this purpose, it is necessary to connect filters, as shown in FIG. 12b, at many stages. This leads to an increase in the size of the analog CR filter 3 and the size of the A/D conversion apparatus. Further, there occurs a problem of an increase in the cost of the A/D conversion apparatus.

Further, in order to make the analog CR filter 3 attenuate the high-frequency signal components that cannot be attenuated by the digital moving average filter 6, there is a method of lowering the cutoff frequency of the analog CR filter 3. However, in order to lower the cutoff frequency, it is necessary to increase the capacity of the capacitor C and the resistance of the resistor R that constitute the analog CR filter 3. This measure also has a problem of increasing the sizes of the analog CR filter 3 and the A/D conversion apparatus. Further there occurs a problem of an increase in the cost of the A/D conversion apparatus.

In the frequency versus attenuation characteristics of the digital moving average filter shown in FIGS. 13a and 13b, the attenuation becomes a maximum (infinite) at predetermined frequency intervals at a lower frequency side than the sampling frequency fsd (100 kHz) of the digital moving average filter 6. This is because the digital moving average filter 6 executes the moving average processing, and the number of peaks of the attenuation corresponds to the number of digital data to be averaged. Specifically, when the number of digital data to be averaged by the digital moving average filter 6 is "2" (that is, the averaging of the data for the past two times), the number of the peaks of the attenuation becomes "1". When the number of digital data to be averaged is "4" (that is, the averaging of the data for the past four times), the number of the peaks of the attenuation becomes "3".

In FIGS. 13a and 13b, the abscissa shows frequency as a logarithm, and the ordinate linearly displays attenuation. Therefore, it is difficult to know from these diagrams the number of peaks of attenuation generated in the frequency area of the sampling frequency 100 kHz and below. Actually, the number of digital data to be averaged by the digital moving average filter 6 is "16". Therefore, the peak number of attenuation is "15". This peak appears at frequency intervals (6.25 kHz) of the sampling frequency fsd (100 kHz) divided into sixteen (refer to FIG. 3 to be explained later in an embodiment). Consequently, the cutoff frequency of the digital moving average filter becomes lower as the number of the digital data to be averaged (the sampling number of the digital data) becomes larger.

SUMMARY OF THE INVENTION

The present invention has been made in the light of the above problems. It is an object of the present invention to provide a filtering method capable of attenuating unnecessary high-frequency signal components that cannot be attenuated by a digital moving average filter, without using an analog CR filter as a pre-filter, and an A/D conversion apparatus having a filtering function.

In order to achieve the above object, according to a first aspect of the present invention, there is provided a filtering method. In this filtering method, first, an analog moving average filter that averages input signals at every constant period in synchronism with a clock of a sampling frequency fsa is used to carry out a moving average processing of analog input signals. Then, an A/D converter A/D is used to convert the moving-averaged analog input signal. Further, a digital moving average filter, that operates at a sampling frequency fsd that is n times (where n is a positive integer including 1) the sampling frequency fsa, is used to moving average digital data that has been obtained by the A/D conversion.

In other words, according to the above aspect of the invention, in the filtering method, an analog moving average filter is used instead of the conventional analog CR filter as a pre-filter.

This is because the analog moving average filter averages the input signals at every constant period in synchronism with the clock of the sampling frequency fsa. Therefore, the attenuation becomes maximum (theoretically infinite) in the frequency area in which the frequency is n times the sampling frequency fsa (for example, 100 kHz, 200 kHz, 300 kHz, etc. when the sampling frequency fsa is 100 kHz) (refer to FIG. 2a to be explained later in the embodiment).

In other words, the inventors of the present application have noticed that in the analog moving average filter, the attenuation becomes infinite in the frequency range in which the frequency is n times the sampling frequency fsa, while the attenuation becomes minimum (approximately zero) in the frequency range in which the frequency is n times the sampling frequency fsd in the digital moving average filter. Therefore, the inventors have used the analog moving average filter as a pre-filter of the A/D converter, thereby to attenuate the high-frequency signal components corresponding to the unnecessary signal passing range that is generated in the digital moving average filter, based on the filter characteristics of the analog moving average filter.

In the analog moving average filter, because of its operation characteristic, the attenuation becomes infinite in the frequency range in which the frequency is n times the sampling frequency fsa, regardless of the structure of this filter. Therefore, unlike the conventional apparatus that uses the analog CR filter as a pre-filter, it is not necessary to take measures such as to increase the order of the filter or lower the cutoff frequency in order to attenuate the high-frequency signal components corresponding to the unnecessary signal passing range that is generated in the digital moving average filter. As a result, when the method of the present invention is used, it is possible to realize an A/D conversion apparatus that can obtain desired A/D conversion characteristics without receiving an influence of noise, in a more simple structure than the conventional structure.

In the method of the present invention, the sampling frequency fsd of the digital moving average filter is set to n times the sampling frequency fsa of the analog moving average filter. This is for the following reasons. When the sampling frequency fsd of the digital moving average filter is set in this way, the unnecessary signal passing range generated in the digital moving average filter becomes the frequency range in which the frequency "fsa×n" is further multiplied by n times. This frequency range is superimposed without fail on the frequency range in which the attenuation becomes infinite in the analog moving average filter.

As the analog moving average filter averages input signals at every one clock period (a sampling period) of the sampling frequency fsa, it is possible to define the operation characteristic as an integration result of a continuous function x(t) during a predetermined time t to (t+T) that is divided by the time T, as shown in the following expression (1). Therefore, it is possible to realize the analog moving average filter by using an analog circuit that satisfies the next expression (1). More specifically, it is possible to use a delay line filter that is disclosed in Kokai (Unexamined Patent Publication) No. 8-32408, for example.

$$u(\tau, t) = \frac{1}{\tau}\int_{t}^{t+\tau} \sin 2\pi f v dv = \frac{1}{2\pi f \tau}\sqrt{2(1 - \cos 2\pi f \tau)} \sin(2\pi f t + \phi) \quad (1)$$

$$\phi = \tan^{-1}\frac{1 - \cos 2\pi f \tau}{\sin 2\pi f \tau}$$

A phase frequency characteristic φa of the analog moving average filter defined in the above equation (1) can be expressed as given in the following equation (2), when the sampling frequency is fsa and the frequency of the input signal is f. This phase frequency characteristic φa has a linear characteristic that is in a leading phase relative to an input signal and is proportional with the frequency f of the input signal.

$$\phi a = (1/2) \times (1/fsa) \times 2\pi f \quad (2)$$

On the other hand, a phase frequency characteristic φd of the digital moving average filter can be expressed as given in the following equation (3), when the sampling frequency is fsd and the number of data for moving average is N. This phase frequency characteristic φd has a linear characteristic that is in a delay phase relative to an input signal and is proportional with the frequency f of the input signal.

$$\phi d = -(N-1)/2 \times (1/fsd) \times 2\pi f \quad (3)$$

Therefore, when the input signals are moving averaged before and after the A/D conversion by using the analog moving average filter and the digital moving average filter as in the method of the present invention, it is possible to offset phase changes that are generated in the filters and reduce the change in the phase of the obtained digital data from the phase of the analog input signal.

Particularly, as described later, when the sampling frequencies fsa and fsd are set as the same frequencies, and also when the number N of the data to be moving averaged by the digital moving average filter is 2, it is possible to make the phase frequency characteristics of the filters completely coincide with each other by removing phase deviation (a leading phase and a delay phase). As a result, it is possible to make the phase of the finally obtained digital data and the phase of the analog input signal completely coincide with each other.

As the analog moving average filter is used in place of the conventional analog CR filter, it is preferable that the frequency of the analog input signal that is input to the A/D converter is limited to one half or less (preferably one fifth or less) of the sampling frequency of the A/D converter.

In other words, while the cutoff frequency fc of the analog moving average filter changes depending on the sampling frequency fsa, and fc becomes equal to 0.44×fsa, it is preferable that the sampling frequency fad of the A/D converter is, taking some extra margin into account, set to at least five times the maximum frequency of the analog input signal that passes through the analog moving average filter.

According to a second aspect of the present invention, there is provided a filtering method. In this filtering method, a pulse delay circuit having delay units connected in cascade at a plurality of stages is used to A/D convert an analog input signal. Further, a digital moving average filter is used to moving average digital data that has been obtained by the A/D conversion.

Further, in A/D converting the analog input signal by using the pulse delay circuit, the analog input signal is input to the pulse delay circuit as a signal for controlling the delay time of each delay unit. At the same time, a pulse signal is input to the pulse delay circuit, and the pulse signal is transmitted by sequentially delaying the signal by a delay time of each delay unit. Then, the number of stages of delay units through which the pulse signal has passed within the pulse delay circuit is counted at every constant period in synchronism with a clock of a sampling frequency fstad. Based on this, digital data that expresses a signal level of the analog input signal is generated.

Further, the sampling frequency fsd of the digital moving average filter is set to n times (where n is a positive integer including 1) the sampling frequency fstad at the time of A/D converting the analog input signal by using the pulse delay circuit.

In other words, when the pulse delay circuit has been operated following the method of the present invention, the delay time of the pulse signal when this signal passes through each delay unit within the pulse delay circuit changes according to the signal level of the analog input signal. This delay time varies based on unnecessary high-frequency signal components when the unnecessary high-frequency signal components are superimposed on the analog input signal. However, when the pulse signal passes through each delay unit, the variation component according to the high-frequency signal component is offset. As a result, an average delay time after the pulse signal has passed through the plurality of delay units corresponds to the signal level of a true analog input signal after removing the high-frequency signal components.

Therefore, according to the method of the present invention, the pulse delay circuit is operated as explained above, and the number of stages of delay units through which the pulse signal has passed within the pulse delay circuit at every constant time determined by the period (the sampling period) of the sampling frequency fstad is counted. Based on this count, a moving average of the time taken by the pulse signal to pass through each delay unit is obtained. This moving average is output as digital data that expresses a true signal level of the analog input signal after removing the high-frequency signal components.

Therefore, when the pulse signal has been transmitted within the pulse delay circuit as in the method of the present invention, the pulse delay circuit functions as the analog moving average filter as described in the first aspect of the invention. The number of stages of delay units through which the pulse signal has passed within a constant time determined by the period (the sampling period) of the sampling frequency fstad corresponds to the digital data that has been obtained by A/D converting the moving-averaged analog input signals using the A/D converter described in the first aspect of the invention.

In other words, according to the method of the present invention, the analog moving average filter and the A/D converter described in the first aspect of the invention are realized by using the pulse delay circuit. The digital data obtained by the A/D conversion is moving averaged by the digital moving average filter.

Further, in the method of the present invention, by averaging the analog input signals with the pulse delay circuit, it is also possible to realize a filtering characteristic that the attenuation becomes infinite in the frequency area in which the frequency is n times the sampling frequency fstad that is used to average the analog input signals. Therefore, as in the method of the first aspect of the invention, the sampling frequency fsd of the digital moving average filter is set to n times the sampling frequency fstad at the time of averaging the analog input signals with the pulse delay circuit. With this arrangement, by averaging the analog input signals with the pulse delay circuit, it becomes possible to sufficiently attenuate the high-frequency signal components corresponding to the unnecessary signal passing area that is generated in the digital moving average filter. As a result, it is possible to achieve the object of the present invention.

Further, in the method of the present invention, as the pulse delay circuit averages the input signal at every one clock period (the sampling period) of the sampling frequency fstad, it is also possible to define the operation characteristic as shown in the above equation (1). Further, the phase frequency characteristic ftad of the analog moving average filter that is realized by using the pulse delay circuit also becomes similar to that when the analog moving average filter is structured as a single unit, as shown in the above equation (2).

Therefore, in the method of the present invention, it is also possible to reduce the change in the phase of the digital data finally obtained via the digital moving average filter, from the phase of the analog input signal, in a similar manner to that of the method of the first aspect of the present invention. Particularly, when the sampling frequencies fstad and fsd are set as the same frequencies, and also when the number N of the data to be moving averaged by the digital moving average filter is 2, it is possible to make the phase of the obtained digital data completely coincide with the phase of the analog input signal.

Further, according to the method of the present invention, by using the pulse delay circuit, it is possible to realize the function of the analog moving average filter and the function of the A/D converter described in the first aspect of the present invention. Therefore, it is possible to simplify the structure of the apparatus and it is possible to make the A/D conversion apparatus more compact than that of the first aspect of the invention.

Further, in the method of the present invention, as the function of the analog moving average filter and the function of the A/D converter are realized by using the pulse delay circuit, the sampling frequency of the analog moving average filter and the sampling frequency of the A/D converter coincide with each other. In the function of the analog moving average filter that is realized by using the pulse delay circuit, it is also possible to express the cutoff frequency fc of the filter as being equal to 0.44×ftad, by using the sampling frequency fstad. Therefore, it is considered that the high-frequency signal components that are at least one half of the sampling frequency fstad are A/D converted without being sufficiently attenuated and are aliased as low-frequency components (the aliasing phenomenon).

However, according to the method of the present invention, as the digital data obtained by A/D conversion is moving averaged by the digital moving average filter at a later stage, it is possible to attenuate the high-frequency signal components by this processing in a similar manner to that when the analog moving average filter is used.

Further, in the method of the present invention, the analog input signal is input to the pulse delay circuit as a signal for controlling the delay time of each delay unit. This is for the purpose of controlling the delay time of each delay unit according to the analog input signal. As a detailed input method, the delay units may be constructed of gate circuits, and the analog input signal may be input to the pulse delay circuit as a driving voltage of each gate circuit. Alternatively, the delay units may be constructed of gate circuits, and the analog input signal may be input to the pulse delay circuit as a signal for controlling a driving current that flows to each delay unit.

A gate circuit operates at a higher speed when a driving voltage or a driving current is larger. Therefore, when the delay units are constructed of gate circuits and also when the analog input signal is input to the pulse delay circuit as a driving voltage or a driving current control signal of the gate circuits, it becomes possible to easily change the delay time of the delay units that constitute the pulse delay circuit, according to the signal level of the analog input signal.

Next, according to a third aspect of the present invention, there is provided an A/D conversion apparatus having a filtering function. The A/D conversion apparatus comprises: an analog moving average filter that averages analog input signals at every constant period in synchronism with a clock of a sampling frequency fsa; an A/D converter that A/D converts analog input signals averaged based on the analog moving average processing into digital data; and a digital moving average filter that samples digital data obtained by A/D conversion of the analog input signals by the A/D converter, at a sampling frequency fsd that is n times the sampling frequency fsa, and calculates an average value of sampling data for the past plurality of times obtained by the sampling.

Therefore, according to the A/D conversion apparatus of the third aspect of the invention, it is possible to convert an analog input signal into digital data based on the filtering method of the first aspect of the invention. The analog moving average filter provided as a pre-filter can efficiently attenuate high-frequency signal components corresponding to an unnecessary signal passing area that is generated in the digital moving average filter. Therefore, according to this apparatus, it is not necessary to increase the order of the pre-filter (the analog CR filter) or lower the cutoff frequency in order to obtain a desired A/D conversion characteristic without receiving an influence of noise, unlike the conventional practice. Further, it is possible to realize this apparatus in a simple structure (and at low cost).

Further, according to a fourth aspect of the present invention, there is provided an A/D conversion apparatus having a filtering function. According to this A/D conversion apparatus, in the apparatus of the third aspect of the invention, the digital moving average filter is structured to operate at a sampling frequency fsd that is the same as the sampling frequency fsa of the analog moving average filter, and calculates an average value of sampling data for the past two times that have been obtained by the sampling.

Therefore, according to the apparatus of the fourth aspect of the invention, it is possible to mutually offset the phase change that is generated in the analog moving average filter and the phase change that is generated in the digital moving average filter. As a result, in the A/D conversion apparatus as a whole, it is possible to generate digital data that has no deviation in phase from the phase of the analog input signal.

Further, according to a fifth aspect of the present invention, there is provided an A/D conversion apparatus having a filtering function. This A/D conversion apparatus has a time A/D converter having a filtering function comprising: a pulse delay circuit that has delay units connected in cascade at a plurality of stages to delay an input pulse by a delay time corresponding to a signal level of an analog input signal and output the signal, and that transmits the pulse signal by sequentially delaying the signal by a delay time of each delay unit; and a counting unit that counts the number of stages of delay units through which the pulse signal has passed within the pulse delay circuit at every constant period in synchronism with a clock of a sampling frequency fstad. The A/D conversion apparatus outputs a count value obtained by the counting unit as digital data that expresses a signal level of the analog input signal.

Then, the digital data that is output from the time A/D converter is input to a digital moving average filter. The digital moving average filter samples the digital data at a sampling frequency fsd that is n times (where n is a positive integer including 1) the sampling frequency fstad, and calculates an average value of sampling data for the past plurality of times obtained by the sampling, by moving average processing.

In other words, the A/D conversion apparatus of the fifth aspect of the invention is an apparatus that converts the analog input signal into digital data based on the filtering method of the second aspect of the invention. The time A/D converter uses the pulse delay circuit to moving average the analog input signals and, at the same time, A/D converts the analog input signals.

Therefore, according to the A/D conversion apparatus of the fifth aspect of the invention, it is possible to obtain an effect similar to that of the apparatus of the third aspect of the invention. Further, as the time A/D converter functions as the analog moving average filter and the A/D converter of the third aspect of the invention, it is possible to simplify the structure of the apparatus as compared with the apparatus of the third aspect of the invention. As a result, it is possible to realize the A/D conversion apparatus having a filtering function at a lower cost than that of the apparatus of the third aspect having a similar function.

Further, according to a sixth aspect of the present invention, there is provided an A/D conversion apparatus having a filtering function. According to this A/D conversion apparatus, in the apparatus of the fifth aspect of the invention, the digital moving average filter is structured to operate at a sampling frequency fsd that is the same as the sampling frequency fstad of the time A/D converter, and calculates an average value of sampling data for the past two times that have been obtained by the sampling.

Therefore, according to the apparatus of the sixth aspect of the invention, it is possible to mutually offset the phase change that is generated in the time A/D converter and the phase change that is generated in the digital moving average filter, in a similar manner to that of the apparatus of the fourth aspect of the invention. As a result, in the A/D conversion apparatus as a whole, it is possible to generate digital data that has no deviation in the phase from the phase of the analog input signal.

According to the A/D conversion apparatus having a filtering function in the fifth and sixth aspects of the invention, the time A/D converter realizes the function of the analog moving average filter and the function of the A/D converter, by controlling a delay time of delay units that constitute the pulse delay circuit using an analog input signal, and by detecting the number of stages of delay units through which the pulse signal has passed within the pulse delay circuit at every constant time determined by the period (the sampling period) of the sampling frequency fstad. For a counting unit that counts the number of stages of the delay units through which the pulse signal has passed, the structure of the following seventh aspect of the invention may be used, for example.

According to the seventh aspect of the present invention, there is provided an A/D conversion apparatus having a filtering function. In this A/D conversion apparatus, a counting unit comprises an encoder that converts a reaching position of a pulse signal within a pulse delay circuit into digital data of a predetermined number of bits, and an operating unit that calculates a difference between the latest value and the last value of digital data obtained based on the conversion by the encoder in synchronism with the clock of the sampling frequency fstad. A time A/D converter outputs a result of the operation by the operating unit as digital data that expresses a signal level of an analog input signal.

Therefore, according to the A/D conversion apparatus of the seventh aspect of the invention, digital data that expresses the number of stages of delay units through which a pulse signal has passed within the pulse delay circuit is output repeatedly in synchronism with the clock of the sampling frequency fstad. Therefore, it is possible to continuously execute the moving average processing repeatedly at the digital moving average filter side.

On the other hand, based on the structure of the time A/D converter as described in the seventh aspect of the invention, when the number of sampled digital data to be moving averaged by the digital moving average filter at a later stage becomes larger, the time per one A/D conversion becomes longer. Therefore, it is necessary to increase the number of delay units through which a pulse signal is passed within the pulse delay circuit, corresponding to this time increase. However, the increase in the number of delay units leads to an increase in the number of transistors that constitute the pulse delay circuit. Consequently, the scale of the circuit becomes larger. Therefore, in order to prevent this problem, it is preferable to structure the time A/D converter as described in the following eighth aspect of the invention.

According to the eighth aspect of the present invention, there is provided an A/D conversion apparatus having a filtering function. In this A/D conversion apparatus, a pulse delay circuit provided in a time A/D converter is constructed of a ring delay line that circulates a pulse signal by having delay units connected in a ring shape. A counting unit comprises an encoder that converts a position at which a pulse signal locates within the ring delay line into digital data of a predetermined number of bits, and a counter that detects the number of times of circulation of the pulse signal in the ring delay line.

Further, the counting unit is provided with an operating unit that fetches digital data having an output from the encoder as low-order bit data and a count value of the counter as high-order bit data, in synchronism with the clock of a sampling frequency fstad, and calculates a difference between the latest value and the last value of the fetched digital data. A time A/D converter outputs a result of the operation by the operating unit as digital data that expresses a signal level of an analog input signal.

In other words, based on the above structure, a pulse signal circulates in the ring delay line as the pulse delay circuit. Digital data as a result of the A/D conversion is generated repeatedly in synchronism with the clock, based on the number of circulations (a count value of the counter) of the pulse signal within the ring delay line and the reaching position (the output of the encoder) of the pulse signal within the ring delay line. Therefore, it is possible to freely set the number of delay units that constitute the pulse delay circuit (the ring delay line) without taking into account time taken per one A/D conversion. As a result, according to the A/D conversion apparatus of the eighth aspect of the invention, it is possible to reduce the sizes of the time A/D converter that is used to carry out A/D conversion, and reduce the sizes of the apparatus as a whole.

BRIEF DESCRIPTION OF THE DRAWINGS

FIGS. 3a and 3b are explanatory diagrams for explaining the characteristics of a digital moving average filter of the first embodiment and the effects of the first embodiment.

DETAILED DESCRIPTION OF THE PREFERRED EMBODIMENTS

Preferred embodiments of the present invention will be explained in detail below with reference to the attached drawings.

[First Embodiment]

Figure 1:
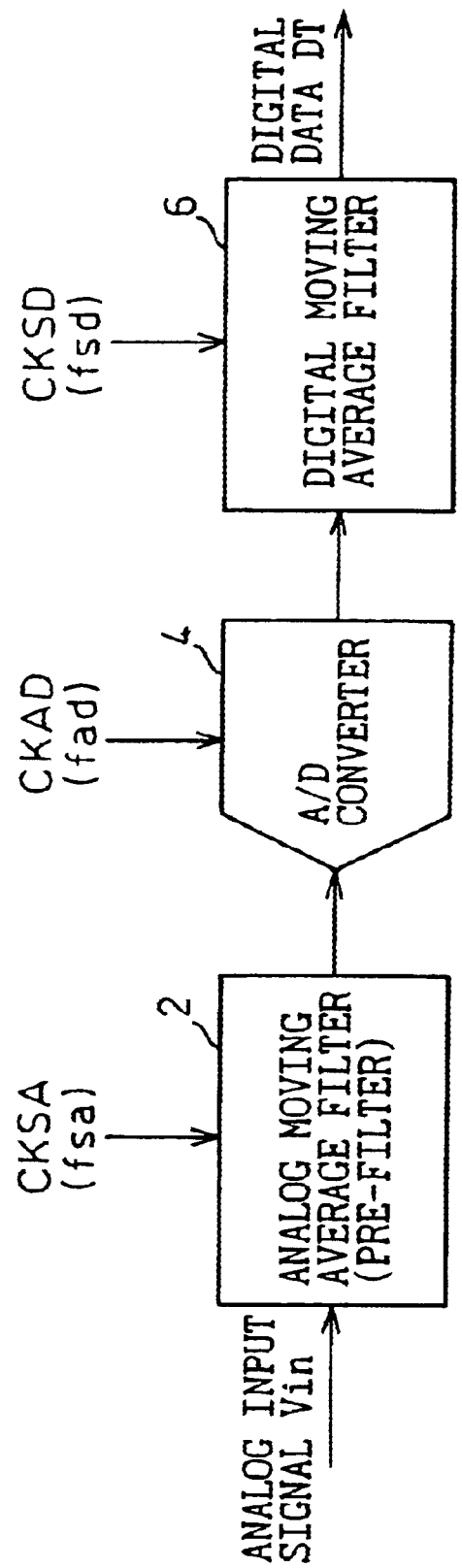
FIG. 1 is a block diagram showing a structure of an A/D conversion apparatus according to a first embodiment of the present invention.

FIG. 1 is a block diagram showing a structure of an A/D conversion apparatus according to a first embodiment of the present invention.

The A/D conversion apparatus of the present invention is an application of the first and third aspects of the invention. This A/D conversion apparatus comprises: an analog moving average filter 2 that averages (integrates) analog input signals Vin that have been input within a constant period (a sampling frequency), at each constant period in synchronism with a clock CKSA of a sampling frequency fsa; an A/D converter 4 that A/D converts analog input signals that have passed through this analog moving average filter 2, in synchronism with a clock CKAD of a sampling frequency fad; and a digital moving average filter 6 that samples digital data Dad that have been output from the A/D converter 4, in synchronism with a clock CKSD of a sampling frequency fsd.

Figure 12A:
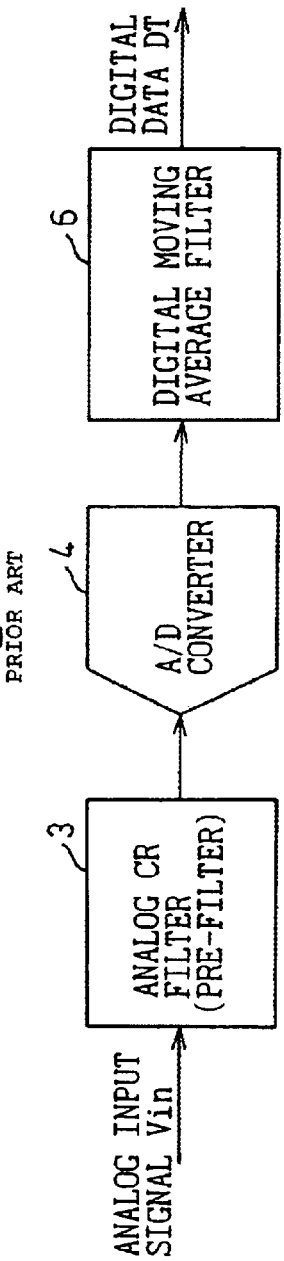
FIGS. 12a, 12b and 12c are explanatory diagrams showing structures of a conventional A/D conversion apparatus.
Figure 12B:
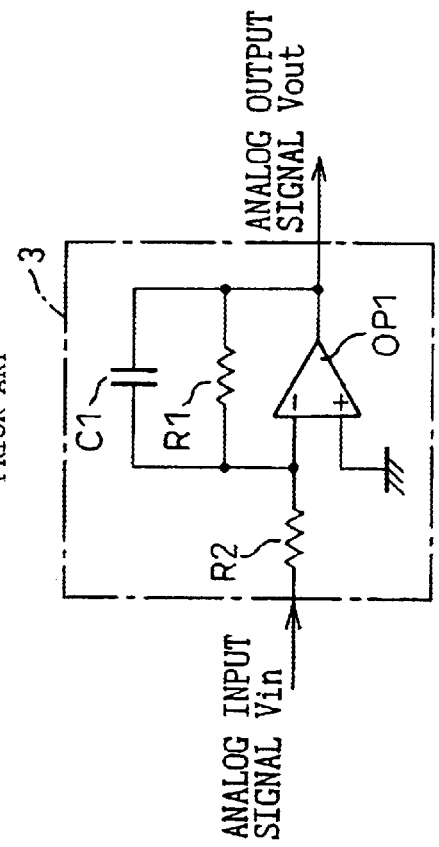
Figure 12C:
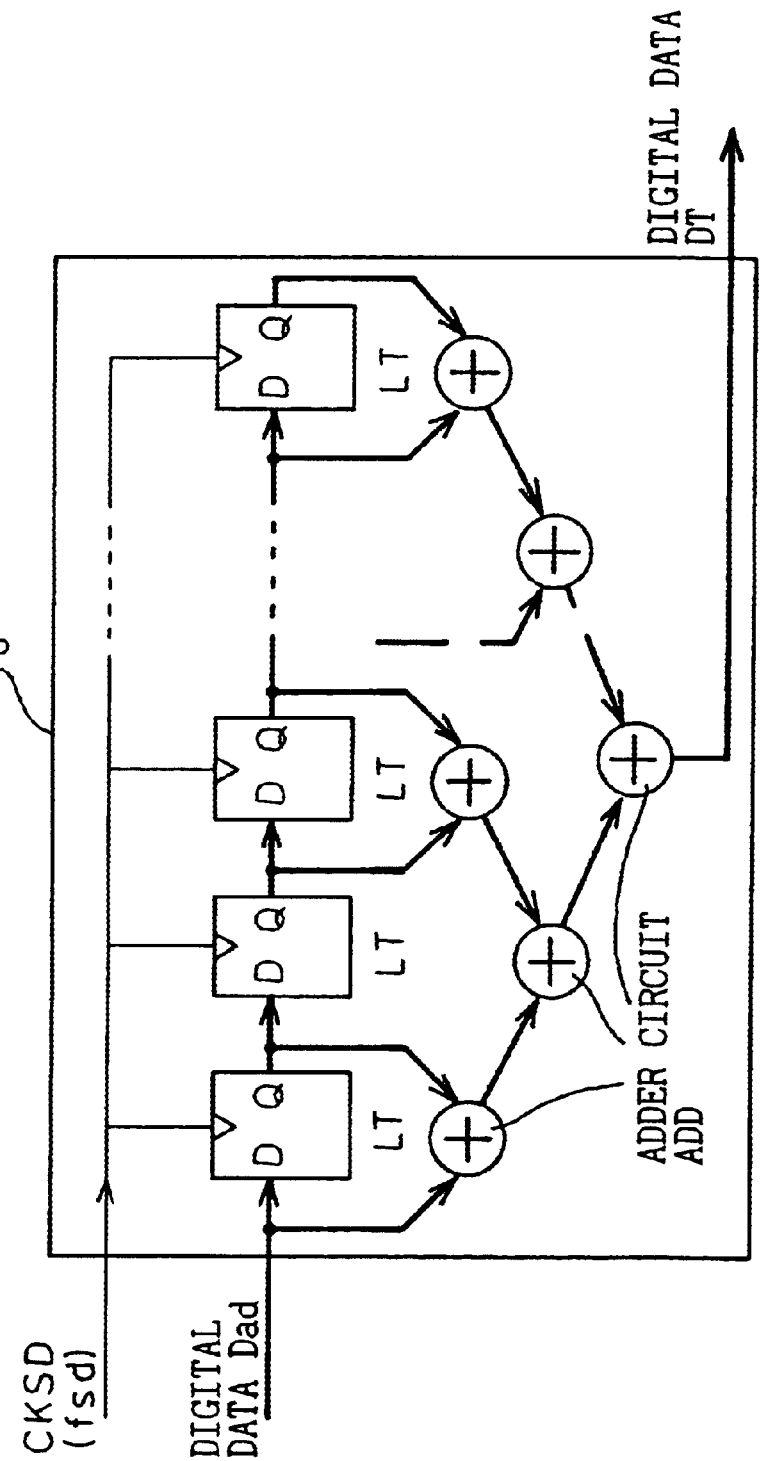

The A/D converter 4 is a unit that is similar to the conventional unit, as shown in FIG. 12a. For example, a general A/D converter such as a sequential comparison type unit or a parallel comparison type unit is used for this A/D converter 4. Further, the digital moving average filter 6 is also a unit that is similar to the conventional unit as shown in FIG. 12a. For example, it is possible to structure the digital moving average filter 6 with the latch circuits LT and the adder circuits ADD, as shown in FIG. 12c. It is also possible to realize this digital moving average filter 6 based on the arithmetic processing of a microcomputer.

On the other hand, the analog moving average filter 2 is a unit that averages the analog input signals Vin at every constant period of the clock CKSA of the sampling frequency fsa. The operation characteristic is as defined by the above equation (1). As a specific example of the analog moving average filter 2, the delay line filter that is disclosed in Kokai (Unexamined Patent Publication) No. 8-32408 can be used.

In the present embodiment, the sampling frequency fad of the A/D converter 4 has been set to be larger than the above sampling frequencies fsa and fsd of the filters 2 and 6 respectively, and has also been set to be at least five times the maximum frequency of a moving-averaged analog input signal after the analog input signals have passed through the analog moving average filter 2. This is based on the above "sampling theorem". In the present embodiment, the occurrence of the aliasing phenomenon of high-frequency signal components due to A/D conversion is prevented by the setting of this frequency.

Further, the sampling frequency fsd of the digital moving average filter 6 is set to a frequency that is equal to the sampling frequency fsa of the analog moving average filter 2, or is an integer times this sampling frequency fsa, for the following reason, as described above. The attenuation becomes maximum (theoretically infinite) in the frequency range in which the frequency is n times (where n is a positive integer of 1, 2, 3, etc.) the sampling frequency fsa in the analog moving average filter 2 (refer to FIG. 2a). When the sampling frequency fsd of the digital moving average filter 6 is set as described above in the digital moving average filter 6, the frequency range in which the attenuation becomes maximum in the analog moving average filter 2 is superimposed on the frequency range (refer to FIG. 13a) in which the attenuation becomes approximately zero in the digital moving average filter 6.

Figure 2A:
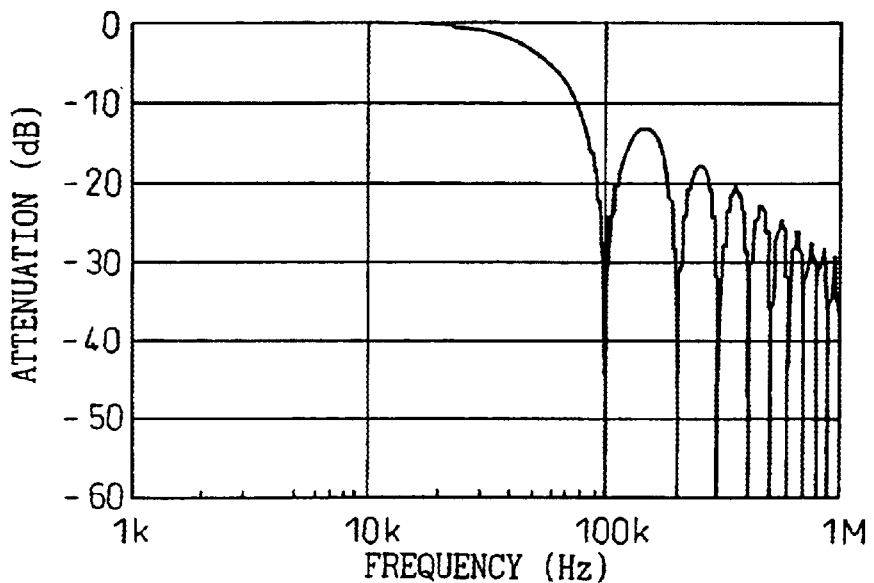
FIGS. 2a and 2b are explanatory diagrams for explaining the characteristics of an analog moving average filter of the first embodiment and the effects of the first embodiment.

In other words, FIG. 2a shows the frequency versus attenuation characteristics of the analog moving average filter 2 when the sampling frequency fsa is 100 kHz. As is clear from this diagram, when the sampling frequency fsa is 100 kHz, the frequency range in which the attenuation becomes theoretically maximum in the analog moving average filter 2 becomes the frequency range in which the sampling frequency fsd is multiplied by n times like 100 kHz, 200 kHz, 300 kHz, etc.

Figure 13A:
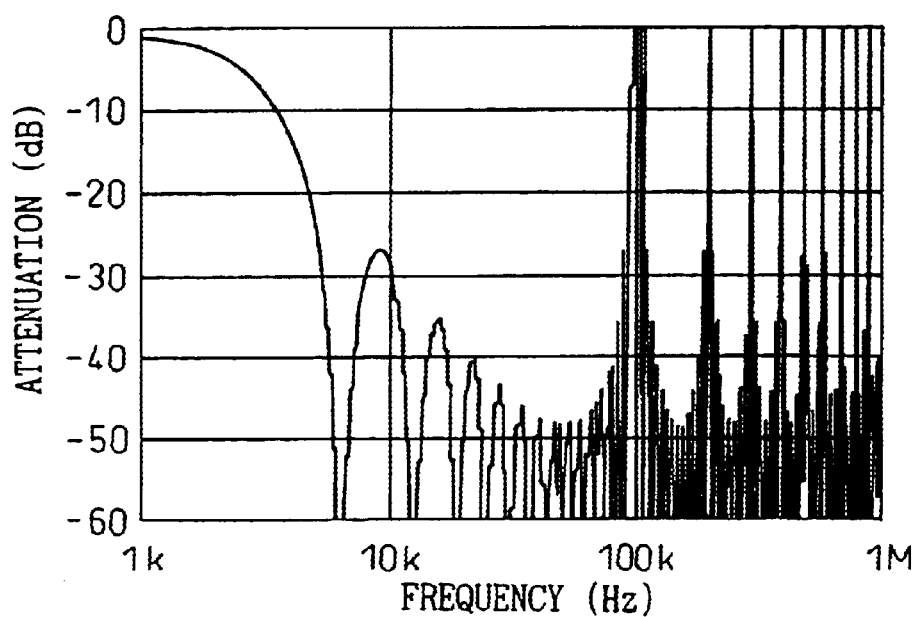
FIGS. 13a and 13b are explanatory diagrams for explaining problems of the conventional A/D conversion apparatus.
Figure 13B:
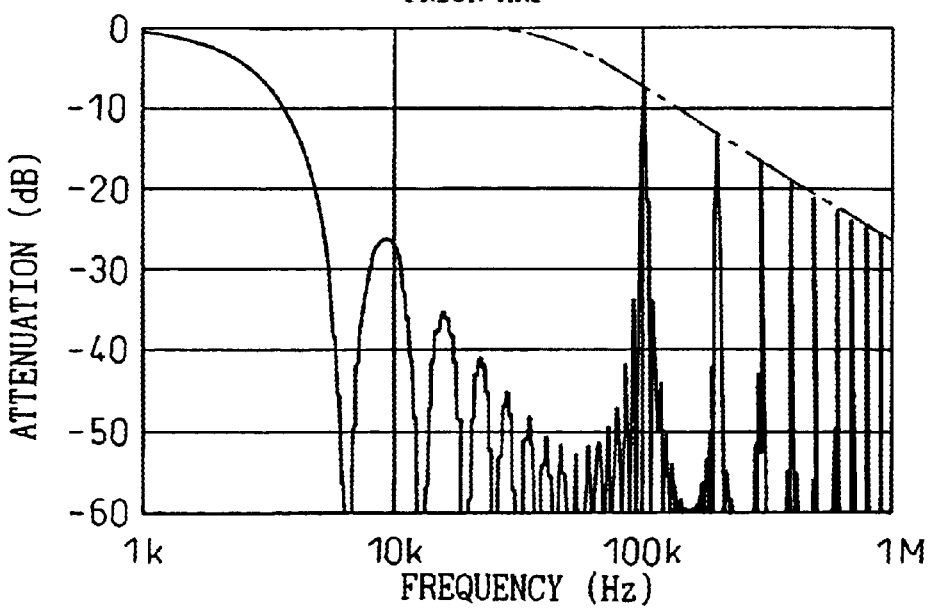

On the other hand, when the sampling frequency fsd of the digital moving average filter 6 is 100 kHz, the frequency range in which the attenuation becomes approximately zero in the digital moving average filter 6 becomes the frequency range in which the sampling frequency fsd is multiplied by n times like 100 kHz, 200 kHz, 300 kHz, etc. as shown in FIG. 13a.

Figure 2B:
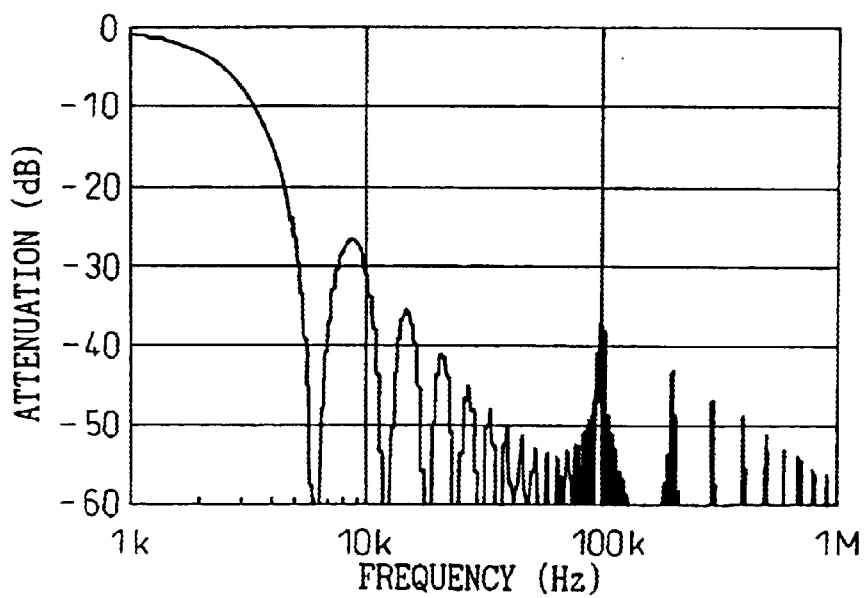

Further, in the present embodiment, the analog moving average filter 2 and the digital moving average filter 6 that have these filtering characteristics are disposed before and after the A/D converter 4. Therefore, it is possible to obtain the frequency versus attenuation characteristics that are the combination of the characteristics of the filters 2 and 6, as the total A/D conversion apparatus as shown in FIG. 2b. Consequently, it is possible to correct the attenuation in the frequency area in which the digital moving average filter 6 cannot attenuate a high-frequency signal such that the analog moving average filter 2 provides a maximum attenuation in this frequency area.

Figure 3A:
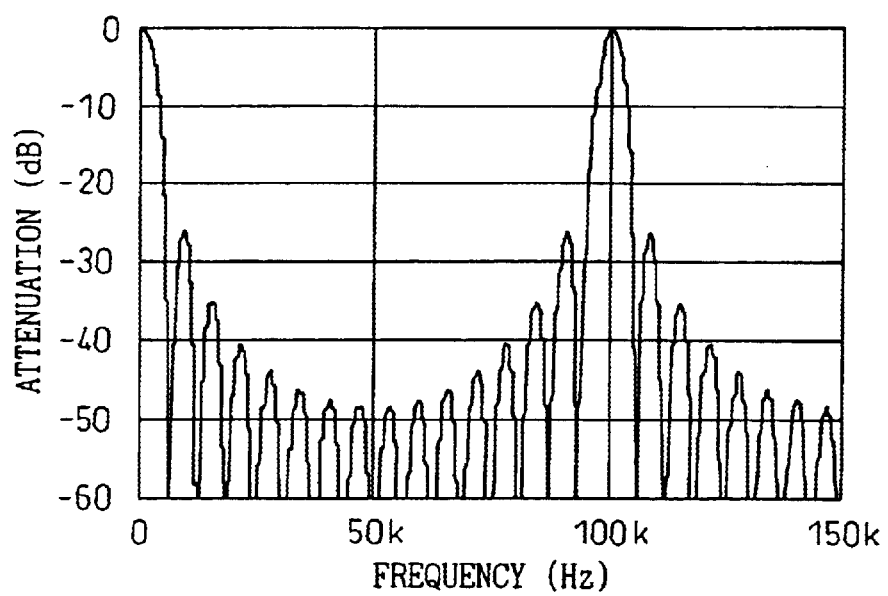

FIG. 3a is a graph that shows the frequency versus attenuation characteristics of the digital moving average filter 6, where the abscissa shows frequency as a linear axis. FIG. 3b is a graph that shows combined characteristics of the frequency versus attenuation characteristics of the filters 2 and 6 near the sampling frequency 100 kHz, where the abscissa shows frequency as a linear axis. As is clear from these diagrams, in the digital moving average filter 6, the attenuation decreases in an angular shape near the sampling frequency 100 kHz (and near a frequency that is n times this sampling frequency). On the other hand, the analog moving average filter 2 corrects the attenuation, as if a wedge is driven into the peak, at which the attenuation becomes minimum (approximately zero) in the digital moving average filter 6. Therefore, when the analog moving average filter 2 is used as a pre-filter as in the present embodiment, it is possible to correct extremely efficiently the unnecessary signal passing range that is generated in the digital moving average filter 6.

Therefore, according to the A/D conversion apparatus of the present embodiment, unlike the conventional apparatus that uses the analog CR filter as a pre-filter, it is not necessary to take measures such as to increase the order of the filter or lower the cutoff frequency in order to attenuate the high-frequency signal components corresponding to the unnecessary signal passing range that is generated in the digital moving average filter. As a result, it becomes possible to realize the A/D conversion apparatus that can remove the unnecessary high-frequency signal components, in an extremely simple structure.

Further, as described above, it is possible to describe the phase frequency characteristic φa of the analog moving average filter 2 using the above equation (2), and describe the phase frequency characteristic φd of the digital moving average filter 6 using the above equation (3). Therefore, according to the A/D conversion apparatus of the present embodiment, it is possible to cancel out the phase changes that are generated in the filters 2 and 6, and reduce the change in the phase of the obtained digital data from the phase of the analog input signal.

Figure 4A:
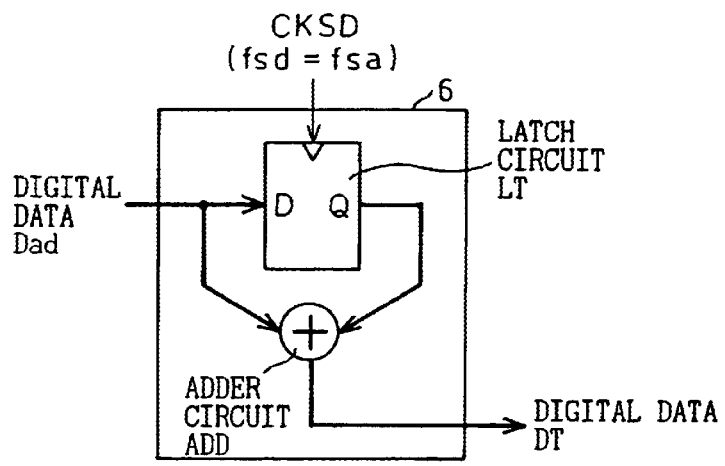
FIGS. 4a and 4b are explanatory diagrams for explaining a structure example of the digital moving average filter of the first embodiment and phase frequency characteristics that are obtained from this structure.
Figure 4B:
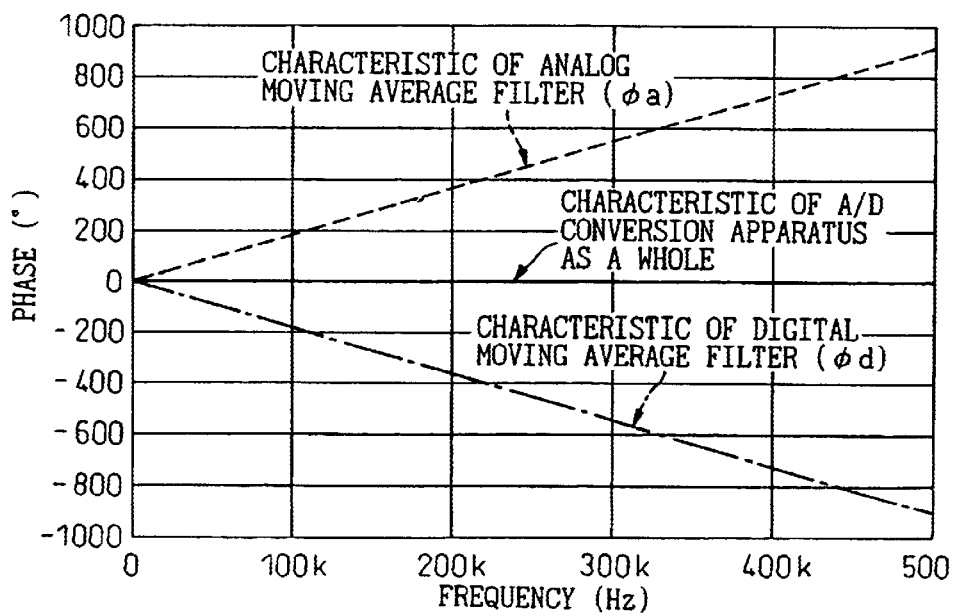

Further, as shown in FIG. 4a, when the digital moving average filter 6 is constructed of one latch circuit LT and one adder circuit ADD, and also when the frequency (the sampling frequency fsd) of the clock CKSD coincides with the sampling frequency fsa of the analog moving average filter 2, for example, the phase frequency characteristic φa of the analog moving average filter 2 can completely coincide with the phase frequency characteristic φd of the digital moving average filter 6 excluding phase deviation directions (a leading phase and a delay phase), as shown in FIG. 4b. As a result, it becomes possible to make the phase of the digital data DT that is output from the digital moving average filter 6 completely coincide with the phase of the analog input signal Vin.

In other words, according to the digital moving average filter 6 shown in FIG. 4a, this filter sums the latest digital data Dad obtained by the A/D converter 4 and the digital data Dad of one period before that has been latched by the latch circuit LT, in synchronism with the clock CKSD, thereby to moving average the digital data Dad obtained by the A/D converter 4. Therefore, the number N of data after the moving average becomes "2". Consequently, the phase frequency characteristic φd coincides with the phase frequency characteristic φa of the analog moving average filter 2. As a result, it becomes possible to generate digital data of which phase has no deviation from the phase of the analog input signal Vin in the A/D conversion apparatus as a whole.

The digital moving average filter 6 shown in FIG. 4a corresponds to the digital moving average filter described in the fourth aspect of the invention.

[Second Embodiment]

Figure 5A:
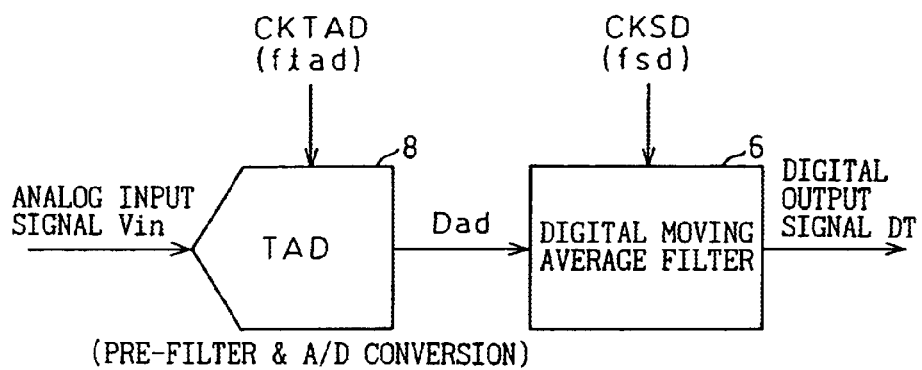
FIGS. 5a and 5b are block diagrams showing structures of an A/D conversion apparatus and a TAD according to a second embodiment of the present invention.
Figure 5B:
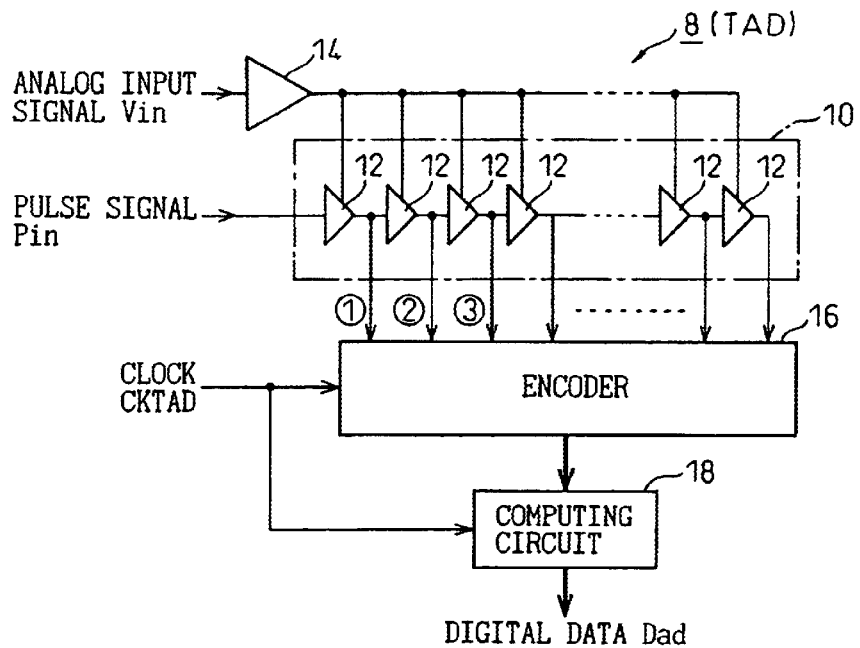

FIGS. 5a and 5b are block diagrams showing structures of an A/D conversion apparatus according to a second embodiment of the present invention.

The A/D conversion apparatus of the present invention is an application of the second and fifth aspects of the invention. As shown in FIG. 5a, the A/D conversion apparatus is constructed of a time A/D converter (hereinafter to be referred to as a TAD) 8 that converts an analog input signal Vin into digital data in synchronism with a clock CKTAD of a sampling frequency ftad, and a digital moving average filter 6 that is similar to that of the first embodiment.

As shown in FIG. 5b, the TAD 8 is constructed of a pulse delay circuit 10 that is structured by having delay units 12 connected in cascade over a plurality of stages to output a pulse signal Pin by delaying it by a predetermined delay time, a buffer 14 that supplies an analog input signal Vin as a driving voltage to the delay units 12 that constitute the pulse delay circuit 10, an encoder 16 that detects a reaching position of a pulse signal within the pulse delay circuit 10 at a rise timing (or at a decline timing) of a clock CKTAD, and outputs digital data that expresses this reaching position, and an operational circuit 18 that latches output data from the encoder 16 at a rise timing (or at a decline timing) of the clock CKTAD, and outputs a difference between the output data that has been latched this time and output data that has been latched last time as a result of A/D conversion (digital data Dad).

In the present embodiment, the TAD 8 corresponds to the time A/D converter described in the seventh aspect of the invention, the operational circuit 18 corresponds to the operating unit described in the seventh aspect of the invention, and the encoder 16 and the operational circuit 18 correspond to the counting unit described in the seventh aspect of the invention.

Further, the delay units 12 that constitute the pulse delay circuit 10 are constructed of gate circuits such as inverters (refer to FIG. 8) as described later. As the pulse signal Pin, an edge of a pulse signal that changes from a high level to a low level or from a low level to a high level is input to the pulse delay circuit 10. Each delay unit 12 sequentially outputs the edge of the pulse signal Pin to the next-stage delay unit 12 by delaying the edge by a predetermined delay time.

In the TAD 8 of the present embodiment having the above structure, the delay time of each delay unit 12 becomes a time corresponding to a signal level (a voltage level) of the analog input signal Vin. When a high-frequency noise component is superimposed on the analog input signal Vin, the delay time of each delay unit 12 varies based on this high-frequency noise component.

Figure 6A:
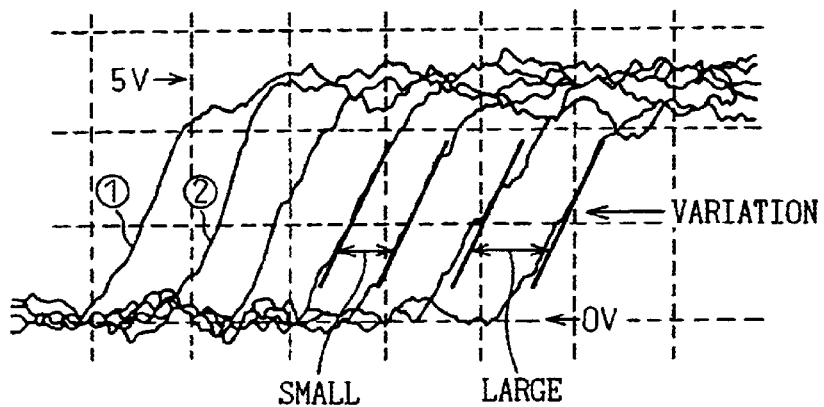
FIGS. 6a, 6b and 6c are explanatory diagrams for explaining the operation of the TAD that constitutes the A/D conversion apparatus of the second embodiment.

FIG. 6a shows an output waveform from each delay unit 12 when the pulse signal Pin is input to the pulse delay circuit 10 and this pulse signal Pin is transmitted to within the pulse delay circuit 10. As is clear from this diagram, when a high-frequency noise component is superimposed on the analog input signal Vin, the driving voltage of each delay unit 12 varies based on this high-frequency noise component. Therefore, the delay time varies when the pulse signal Pin is passed through each delay unit 12. Specifically, the delay time of the delay unit 12 that passes the pulse signal Pin at the timing when a positive high-frequency noise component is superimposed with the analog input signal Vin becomes shorter than a standard time when a high-frequency noise component is not superimposed with the analog input signal Vin (refer to "small" in the diagram). On the other hand, the delay time of the delay unit 12 that passes the pulse signal Pin at the timing when a negative high-frequency noise component is superimposed with the analog input signal Vin becomes longer than the standard time (refer to "large" in the diagram).

According to the TAD 8 of the present embodiment, the encoder 16 and the operational circuit 18 are used to detect the number of stages of delay units 12 through which the pulse signal Pin has passed within one period in synchronism with the period of the clock CKTAD. A result of this detection (the number of stages of delay units 12 through which the pulse signal Pin has passed) is output as digital data Dad that expresses a result of the A/D conversion of-the analog input signal Vin.

Figure 6B:
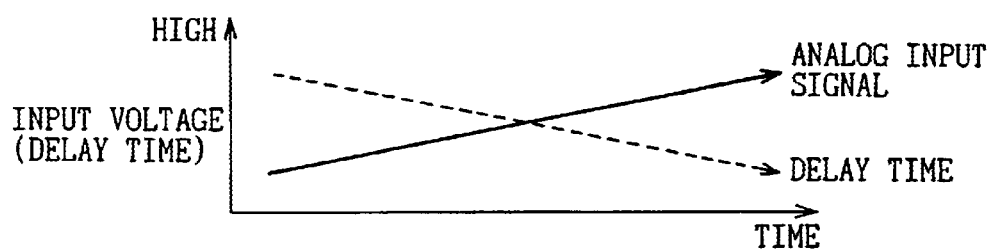
Figure 6C:
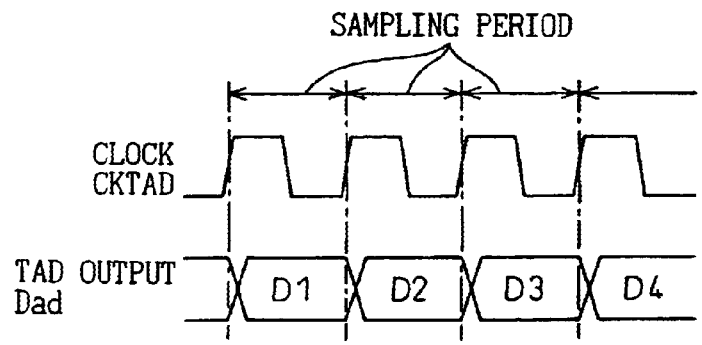

In other words, the delay time of the delay units 12 that constitute the pulse delay circuit 10 becomes shorter as the signal level of the analog input signal Vin becomes higher, according to the signal level of the analog input signal Vin, as shown in FIG. 6b. It is possible to cancel out (or, average) variations in the delay time due to the positive and negative high-frequency noise signal components that are superimposed with the analog input signal Vin, by inputting the pulse signal Pin to the pulse delay circuit 10 and sequentially passing the pulse signal Vin through the delay units 12. Therefore, in the present embodiment, as shown in FIG. 6c, by setting one period of the clock CKTAD as a sampling period, the number of stages of delay units 12 through which the pulse signal Pin has passed within this period is detected. For each sampling period, digital data Dad (D1, D2, etc.) that is equivalent to the moving-averaged value of the signal levels of the analog input signals Vin is generated.

Therefore, the TAD 8 as a single unit has the function of the analog moving average filter 2 for removing the high-frequency signal components from the analog input signal Vin, and the function of the A/D converter 4 for converting the signal level of the analog input signal Vin into digital data Dad.

Figure 7A:
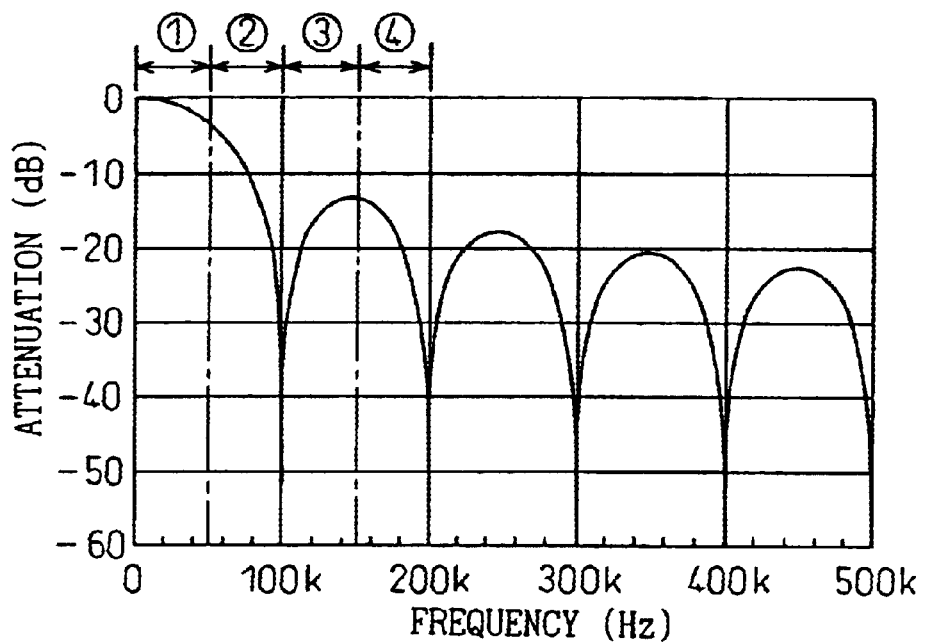
FIGS. 7a and 7b are explanatory diagrams for explaining the characteristics of the TAD of the second embodiment.

Further, according to this TAD 8, as shown in FIG. 7*a*, the pulse delay circuit 10 is used to average the analog input signals Vin. Based on this, it is possible to realize the filtering characteristic where the attenuation becomes maximum in the frequency range in which the frequency is n times the sampling frequency fstad that is used for the averaging (the filtering characteristic that is similar to the characteristic of the analog moving average filter 2 shown in FIG. 2*a*). Therefore, in a similar manner to that of the A/D conversion apparatus of the first embodiment, the TAD 8 can sufficiently attenuate the high-frequency signal components corresponding to the unnecessary signal passing range that is generated in the digital moving average filter 6, by setting the sampling frequency fsd of the digital moving average filter 6 to n times the sampling frequency fstad of the TAD 8. FIG. 7*a* shows the frequency versus attenuation characteristics of the TAD 8 when the sampling frequency ftad is 100 kHz.

Further, according to this TAD 8, the pulse delay circuit 10 is used to average the input signals for each one period (the sampling period) of the clock of the sampling frequency fstad. Therefore, it is possible to define the operation characteristic of this TAD by the equation (1), like the operation characteristic of the analog moving average filter 2 of the first embodiment.

Figure 7B:
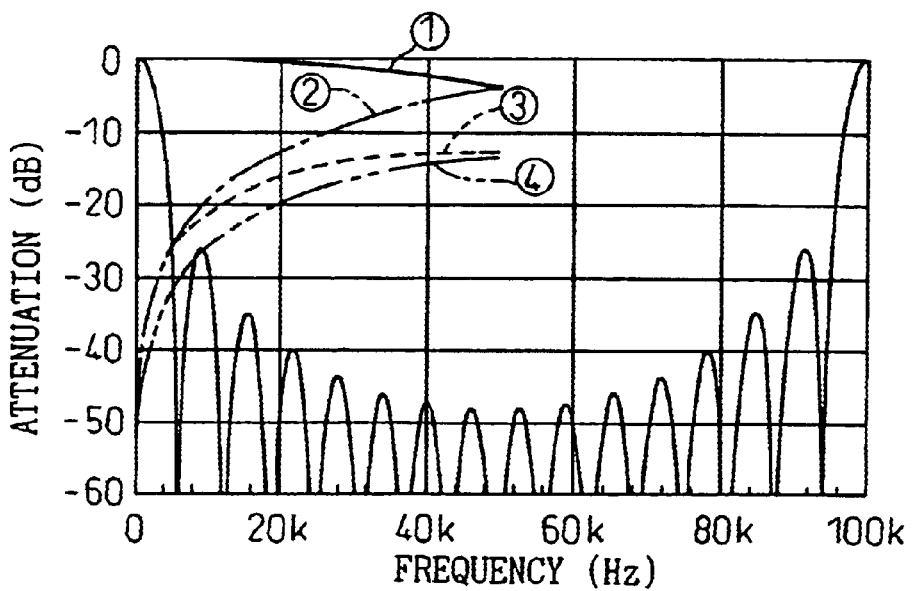

On the other hand, as in the present embodiment, when the TAD 8 is used in place of the analog moving average filter 2 and the A/D converter 4 of the first embodiment, the TAD 8 cannot set the sampling frequency for the analog moving average and the sampling frequency for the A/D conversion as mutually different frequencies. Therefore, an aliasing phenomenon occurs where high-frequency signal components ②, ⓪, ④, ---, that are at least one half of the sampling frequency ftad shown in FIG. 7*a*, appear as apparently low frequency components in the digital data Dad obtained by the TAD 8, as shown in FIG. 7*b*. As a result, a distortion may occur in the waveform of the digital data Dad that is obtained by the TAD 8. In FIG. 7*b*, ① shows a signal component in the area of 0 to 50 kHz, ② shows an unnecessary signal component in the area of 50 kHz to 100 kHz, ③ shows an unnecessary signal component in the area of 100 kHz to 150 kHz, and ④ shows an unnecessary signal component in the area of 150 kHz to 200 kHz.

In other words, the cutoff frequency fc of the TAD 8 is expressed as being equal to 0.44 fs, as is the cutoff frequency of the analog moving average filter 2. Therefore, the high-frequency signal components at least one half of the sampling frequency fstad are A/D converted without being sufficiently attenuated. For example, when the TAD 8 has the characteristic (fstad=100 kHz) as shown in FIG. 7*a*, aliasing of the high-frequency signal components occurs symmetrically with fstad/2=50 kHz, an input signal of 80 kHz appears as a frequency component of 20 kHz, and an input signal of 110 kHz appears as a frequency component of 10 kHz. As a result, a distortion may occur in the waveform of the digital data Dad.

However, in the present embodiment, as the digital moving average filter 6 is provided at a latter stage of the TAD 8, it is possible to restrict the waveform deformation generated by the aliasing, based on the moving average processing of the digital moving average filter 6. For example, FIG. 7*b* shows the frequency versus attenuation characteristics of the digital moving average filter 6 when the sampling frequency fsd is 100 kHz and the number N of the data to be moving averaged is "16", in addition to the unnecessary high-frequency signal components ②, ③, ④, --- that appear in the area of 50 kHz or below due to the aliasing. Therefore, in the A/D conversion apparatus of the present embodiment, it is also possible to realize a filtering characteristic with high attenuation efficiency, as in the first embodiment.

As explained above, according to the A/D conversion apparatus of the second embodiment, by using the TAD 8 having the functions of the analog moving average filter 2 and the A/D converter 4, it is possible to realize the A/D conversion apparatus having a filtering effect (a high-frequency signal reduction effect) that is the same as the A/D conversion apparatus of the first embodiment.

Therefore, the A/D conversion apparatus of the second embodiment becomes more compact than the A/D conversion apparatus of the first embodiment having a similar effect. Consequently, it is possible to exhibit an excellent effect when the A/D conversion apparatus is built into various kinds of control units for an automobile of which reduction in size and weight has been required.

When the time A/D converter (the TAD 8) is used, as in the present embodiment, for the delay units 12 that constitute the pulse delay circuit 10, it is possible to use any kind of circuits that can output the pulse signal Pin by delaying it by a predetermined delay time and that can change the delay time based on a driving voltage. In order to simplify the circuit structure, it is preferable to use a structure for the delay units 12 as shown in FIG. 8*a* or 8*b*.

Figure 8A:
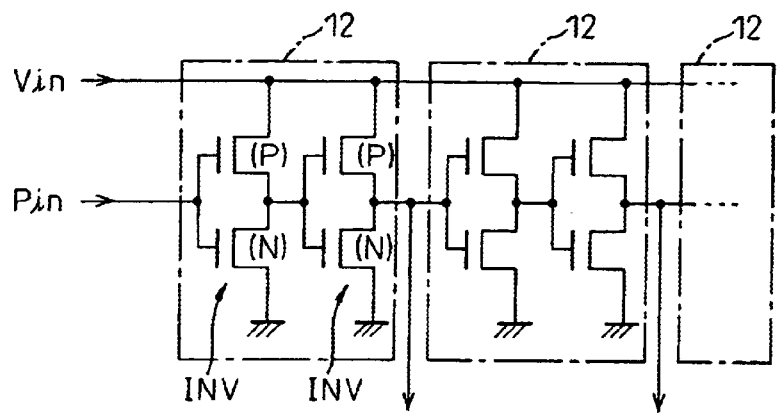
FIGS. 8a, 8b and 8c are explanatory diagrams showing examples of delay units that constitute a pulse delay circuit of the TAD of the second embodiment.
Figure 8B:
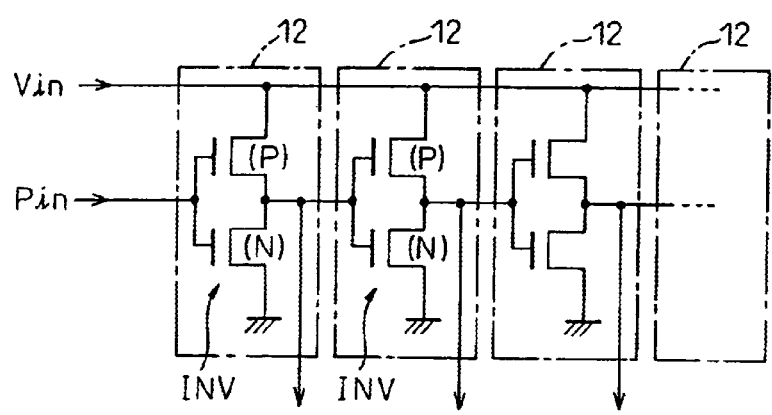

FIG. 8*a* shows a structure that each delay unit 12 that constitutes the pulse delay circuit 10 is constructed of two stages of CMOS inverters (a negative circuit) INV each consisting of a P-channel transistor (FET) and an n-channel transistor (FET). In this structure, a pulse signal Pin is delayed by a predetermined time determined by the operation time of the P-channel transistors and the n-channel transistors that constitute the front and back CMOS inverters INV. FIG. 8*b* shows a structure that each delay unit 12 that constitutes the pulse delay circuit 10 is constructed of one stage of a CMOS inverter (a negative circuit) INV consisting of a P-channel transistor (FET) and an n-channel transistor (FET). In this structure, a pulse signal Pin is delayed by a predetermined time determined by the operation time of the CMOS inverter INV. Based on this structure, it is possible to construct one delay unit 12 with four or two transistors. Further, it is possible to manufacture each transistor extremely easily at the time of manufacturing a CMOS integrated circuit. As a result, it is possible to realize the pulse delay circuit 10 and the TAD 8 at low cost.

Figure 8C:
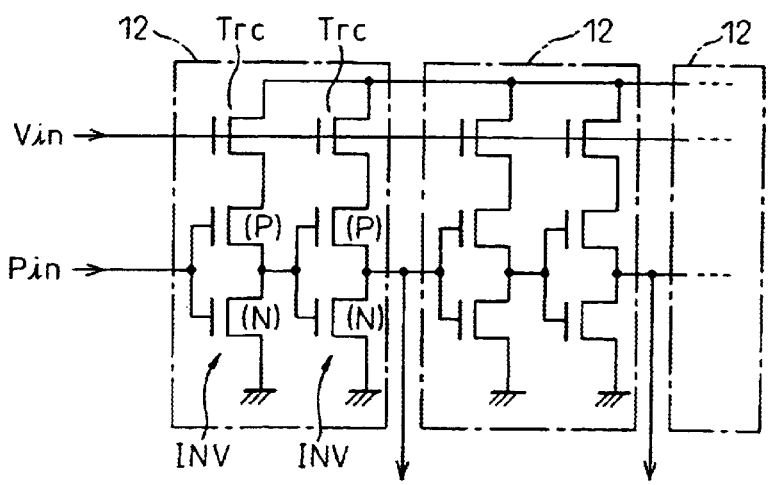

In the above explanation, in order to control the delay time of each delay unit 12 that constitutes the pulse delay circuit 10 according to the voltage level of the analog input signal Vin, this analog input signal Vin has been supplied to each delay unit 12 as a driving voltage. However, as shown in FIG. 8*c*, when a control transistor (FET) Trc for externally controlling the driving current is provided in the CMOS inverter INV that constitutes the pulse delay circuit 12, the analog input signal Vin may be input to the control terminal (gate) of this control transistor Trc.

In other words, the operation time of the gate circuit of the inverter INV or the like also changes according to the driving current that is supplied from a DC current source. Therefore, when the driving current is controlled based on the analog input signal Vin as shown in FIG. 8*c*, it is also possible to operate the pulse delay circuit 10 (and the TAD 8) in a similar manner to the above.

Figure 9:
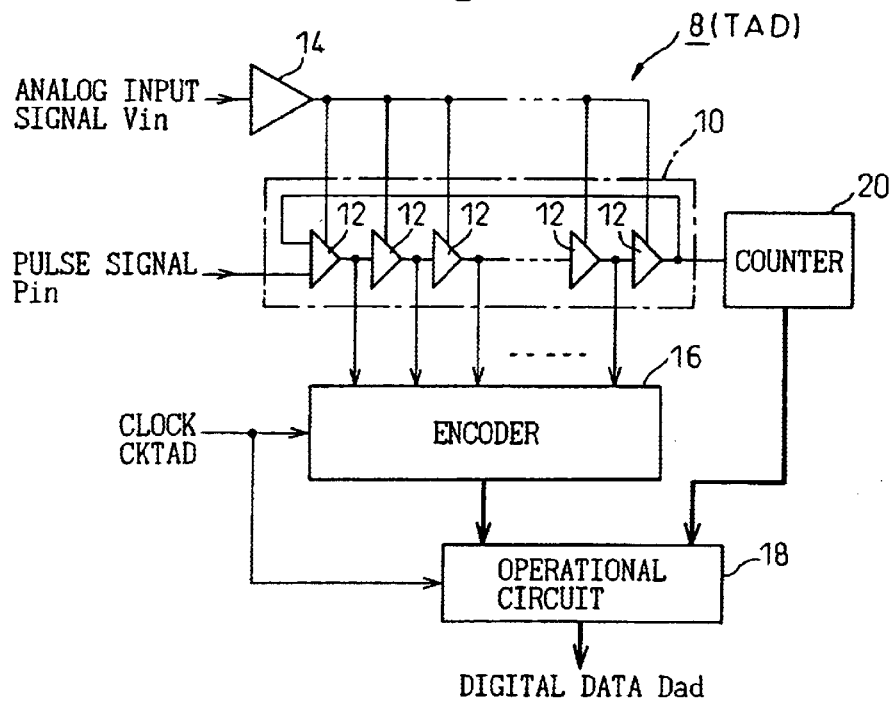
FIG. 9 is an explanatory diagram showing another structure example of the TAD of the second embodiment.

Further, the time A/D converter (the TAD 8) that is used in the present embodiment may be structured as follows. As shown in FIG. 9, by connecting the delay units 12 that constitute the pulse delay circuit 10 in a ring shape, the pulse delay circuit 10 may be structured as a ring delay line that can circulate a pulse signal within the pulse delay circuit 10. In addition to an encoder 16 that detects a circulation position of a pulse signal within the pulse delay circuit 10, a counter 20 is provided that counts the number of circulations of a pulse signal within the pulse delay circuit 10. An operational circuit 18 fetches digital data from the encoder 16 and the counter 20, with output data from the encoder 16 as low-order bit data and output data from the counter 20 as high-order bit data. A difference between the latest value and the last value of the digital data may be output as digital data Dad that expresses a result of A/D conversion of the analog input signal Vin.

Further, in the TAD 8 having the above structure, the pulse signal circulates in the ring delay line as the pulse delay circuit 10. The digital data Dad as a result of A/D conversion is generated repeatedly in synchronism with the clock, based on the number of circulations of the pulse signal within the ring delay line (a count value of the counter 20) and the position at which the pulse signal locates within the ring delay line (an output of the encoder 16). Therefore, as compared with the TAD 8 shown in FIG. 5b, it is possible to reduce sizes of the TAD 8 (and the A/D conversion apparatus) by reducing the number of delay units 12 that constitute the pulse delay circuit (the ring delay line) 10.

The structure of the ring delay line is explained in detail in Kokai (Unexamined Patent Publication) No. 3-22081, and Kokai (Unexamined Patent Publication) No. 7-154256, and has been known well. Therefore, their explanation will be omitted. Further, the TAD 8 shown in FIG. 9 corresponds to the time A/D converter described in the eighth aspect of the invention, the operational circuit 18 corresponds to the operating unit described in the seventh aspect of the invention, and the encoder 16 and the operational circuit 18 correspond to the counting unit described in the eighth aspect of the invention.

[Experiment Example]

Next, in order to confirm the effect of reducing the high-frequency signal components (noise) by the A/D conversion apparatus having a filtering function according to the present invention, the A/D conversion apparatus of the above second embodiment is used as an input unit that A/D converts a detection signal from a scanning position detecting sensor (a coil sensor) of a resonance scanner 30 and inputs this signal into a microcomputer or the like. Then, a detection signal and digital data DT after A/D conversion are measured respectively. This experiment example will be explained below.

Figure 10:
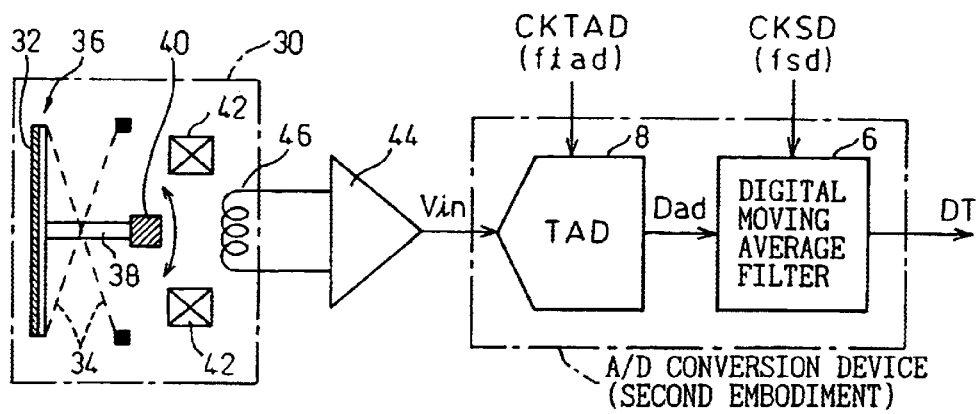
FIG. 10 is an explanatory diagram showing an application example of the A/D conversion apparatus of the second embodiment.

As shown in FIG. 10, the resonance scanner 30 is constructed of a scanner main body 36 that has a light reflection section 32 formed at the front to scan light and is supported by a thin supporting plate 34 to oscillate resonantly, a magnet 40 that is fitted to a rod 38 projected from the rear end of the scanner main body 36, and driving coils 42 that are disposed on the left and right sides of the magnet 40. A current is conducted to the driving coils 42 to generate a magnetic flux, thereby to make the magnet 40 and the scanner main body 36 oscillate resonantly. At the back of the magnet 40, there is provided a sensor coil 46 that detects a change in the magnetic flux generated by the resonant driving (displacement) of the magnet 40.

Figure 11A:
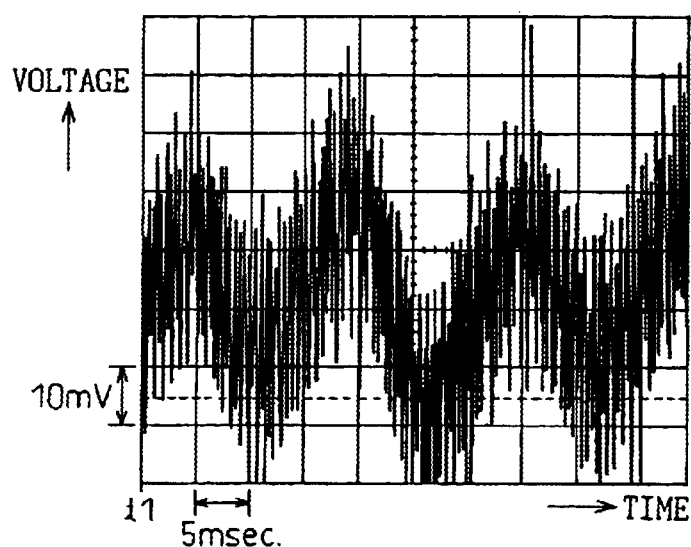
FIGS. 11a, 11b and 11c are explanatory diagrams for explaining the effects of reducing high-frequency noise obtained in the structure shown in FIG. 10.
Figure 11B:
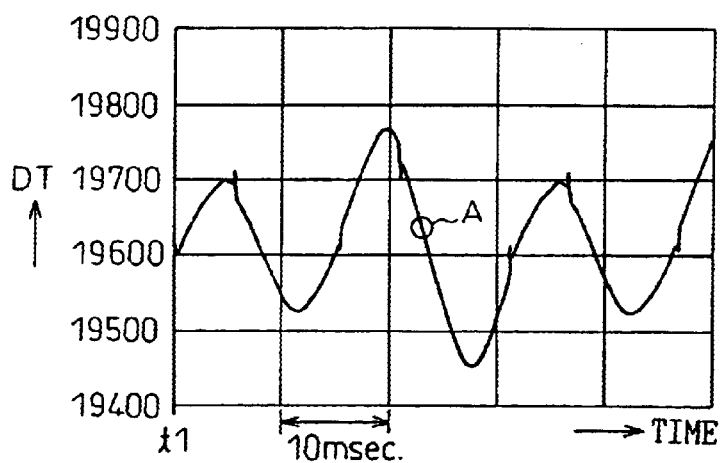
Figure 11C:
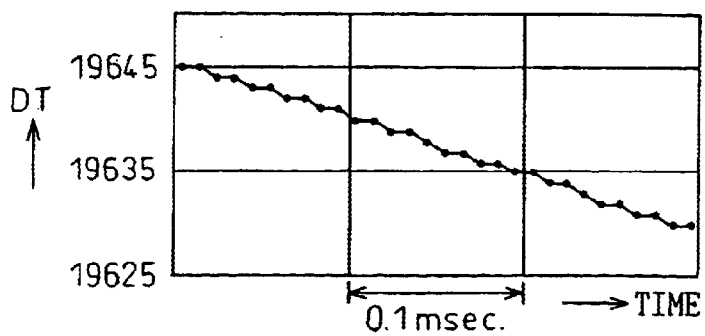

An amplifier 44 amplifies a detection signal (a voltage signal) from this sensor coil 46, and inputs the amplified signal to the A/D conversion apparatus (the second embodiment). The input signal (the analog input signal Vin) and the digital data DT as a result of the A/D conversion are measured. FIGS. 11a to 11c show a result of the measurement.

In the experiment, the TAD shown in FIG. 9 (the time A/D converter equipped with the ring delay line as the pulse delay circuit 10) is used for a TAD 8. For a digital moving average filter 6, there is used a digital moving average filter that carries out a moving average processing two times to average digital data for the past sixteen times. Sampling frequencies fstad and fsd of the TAD 8 and the digital moving average filter 6 are set to 100 kHz respectively.

FIG. 11a is a diagram showing an output (the analog input signal Vin) of the amplifier 46 observed with an oscilloscope. FIG. 11b is a diagram showing an A/D conversion result that is the digital data DT output from the A/D conversion apparatus at a constant period (0.01 msec. period, in this case) plotted along a time axis corresponding the time axis of FIG. 11a. FIG. 11c is an enlarged diagram of a part (a part A) of the line in FIG. 11b.

From these diagrams, it can be seen that the A/D conversion apparatus of the second embodiment that is a combination of the TAD 8 and the digital moving average filter 6 can also completely remove the unnecessary high-frequency signal components that are superimposed with the analog input signal Vin.

In other words, according to the present invention, when the A/D conversion apparatus that A/D converts various kinds of signals and inputs these signals (that is, the signal input unit) is structured based on the combination of the analog moving average filter, the A/D converter and the digital moving average filter, or the combination of the time A/D converter and the digital moving average filter, it becomes possible to realize the A/D conversion apparatus (the signal input unit) that can obtain a satisfactory noise reduction effect, without using the conventional analog CR filter.

In the above experiment, the A/D conversion apparatus of the second embodiment is used as the input unit that inputs a detection signal from the sensor coil provided in the resonance scanner. However, according to the present invention, it is possible to use this A/D conversion apparatus for any kind of apparatus, when the apparatus converts the analog input signal Vin and inputs this signal to the microcomputer or the like. For example, it is possible to use the A/D conversion apparatus of the present invention to A/D convert detection signals from various kinds of sensors such as a temperature sensor, a torque sensor, an angular velocity sensor, a position sensor, etc. It is also possible to use the A/D conversion apparatus as a filtering unit that simply removes noise from an analog input signal.

Further, in the A/D conversion apparatus of the present embodiment, the TAD 8 is provided with the operational circuit 18. However, it is also possible to realize the function of the operational circuit 18 based on the arithmetic processing of a microcomputer, when the function of the digital moving average filter 6 is realized based on the moving average processing of the microcomputer.

What is claimed is:

1. A filtering method comprising the steps of:
   moving averaging analog input signals at every constant period in synchronism with a clock of a sampling frequency fsa;
   A/D converting the moving-averaged analog input signals with an A/D converter; and moving averaging digital data obtained by the A/D conversion, with a digital moving average filter that samples input data at a sampling frequency fsd that is n times (where n is a positive integer including 1) the sampling frequency fsa, and calculates an average value for a plurality of previous sets of sampling data, thereby to generate digital data from an analog input signal after removing unnecessary high-frequency signal components.

2. A filtering method comprising the steps of:

inputting an analog input signal to a pulse delay circuit that is constructed of delay units connected in cascade at a plurality of stages, as a signal for controlling a delay time of each delay unit, at the same time, inputting a pulse signal to the pulse delay circuit, and transmitting the pulse signal by sequentially delaying the pulse signal by the delay time of each delay unit;

counting the number of stages of delay units through which the pulse signal has passed within the pulse delay circuit at every constant period in synchronism with a clock of a sampling frequency fstad, thereby to generate digital data that expresses a signal level of the analog input signal; and moving averaging digital data obtained by the counting, with a digital moving average filter that samples input data at a sampling frequency fsd that is n times (where n is a positive integer including 1) the sampling frequency fstad, and calculates an average value for a plurality of previous sets of sampling data thereby to generate digital data from an analog input signal after removing unnecessary high-frequency signal components.

3. An A/D conversion apparatus having a filtering function comprising:

an analog moving average filter that averages analog input signals at every constant period in synchronism with a clock of a sampling frequency fsa;

an A/D converter that A/D converts analog input signals averaged based on the analog moving average processing into digital data; and a digital moving average filter the samples digital data obtained by A/D conversion of the analog input signals by the A/D converter, at a sampling frequency fsd that is n times (where n is a positive integer including 1) the sampling frequency fsa, and calculates an average value for a plurality of previous sets of sampling data.

4. The A/D conversion apparatus having a filtering function according to claim 3, wherein the digital moving average filter operates at a sampling frequency fsd that is the same as the sampling frequency fsa of the analog moving average filter, and calculates an average value of sampling data for the past two times that have been obtained by the sampling.

5. An A/D conversion apparatus having a filtering function, comprising:

a time A/D converter having a filtering function that includes a pulse delay circuit that has delay units connected in cascade at a plurality of stages to delay an input pulse by a delay time corresponding to a signal level of an analog input signal and output the signal, and that transmits the pulse signal by sequentially delaying the signal by a delay time of each delay unit, and a counting unit that counts the number of stages of delay units through which the pulse signal has passed within the pulse delay circuit at every constant period in synchronism with a clock of a sampling frequency fstad, thereby to output a count value obtained by the counting unit as digital data that expresses a signal level of the analog input signal; and a digital moving average filter that samples the digital data that is output from the time A/D converter at a sampling frequency fsd that is n times (where n is a positive integer including 1) the sampling frequency fstad, and calculates an average value for a plurality of previous sets of sampling data.

6. The A/D conversion apparatus having a filtering function according to claim 5, wherein the digital moving average filter operates at a sampling frequency fsd that is the same as the sampling frequency fstad of the time A/D converter, and calculates an average value of sampling data for the past two times that have been obtained by the sampling.

7. The A/D conversion apparatus having a filtering function according to claim 6, wherein the counting unit comprises:

an encoder that converts a reaching position of a pulse signal within the pulse delay circuit into digital data of a predetermined number of bits; and an operating unit that calculates a difference between the latest value and the last value of digital data obtained based on the conversion by the encoder in synchronism with the clock of the sampling frequency fstad, wherein the time A/D converter outputs a result of the operation by the operating unit as digital data that expresses a signal level of the analog input signal.

8. The A/D conversion apparatus having a filtering function according to claim 5, wherein the counting unit comprises:

an encoder that converts a reaching position of a pulse signal within the pulse delay circuit into digital data of a predetermined number of bits; and an operating unit that calculates a difference between the latest value and the last value of digital data obtained based on the conversion by the encoder in synchronism with the clock of the sampling frequency fstad, wherein the time A/D converter outputs a result of the operation by the operating unit as digital data that expresses a signal level of the analog input signal.

9. The A/D conversion apparatus having a filtering function according to claim 5, wherein the pulse delay circuit is constructed of a ring delay line that circulates the pulse signal by having the delay units connected in a ring shape, and the counting unit comprises:

an encoder that converts a position at which a pulse signal locates, within the ring delay line, into digital data of a predetermined number of bits;

a counter that detects the number of times of circulation of the pulse signal in the ring delay line; and an operating unit that fetches digital data having an output from the encoder as low-order bit data and a count value of the counter as high-order bit data, in synchronism with the clock of a sampling frequency fstad, and calculates a difference between the latest value and the last value of the fetched digital data, wherein the time A/D converter outputs a result of the operation by the operating unit as digital data that expresses a signal level of the analog input signal.

10. The A/D conversion apparatus having a filtering function according to claim 6, wherein the pulse delay circuit is constructed of a ring delay line that circulates the pulse signal by having the delay units connected in a ring shape, and the counting unit comprises:

an encoder that converts a reaching position of a pulse signal within the ring delay line into digital data of a predetermined number of bits;

a counter that detects the number of times of circulation of the pulse signal in the ring delay line; and an operating unit that fetches digital data having an output from the encoder as low-order bit data and a count value of the counter as high-order bit data, in synchronism with the clock of a sampling frequency fstad, and calculates a difference between the latest value and the last value of the fetched digital data, wherein the time A/D converter outputs a result of the operation by the operating unit as digital data that expresses a signal level of the analog input signal.

* * * * *